US009685936B2

(12) United States Patent
Chang et al.

(10) Patent No.: US 9,685,936 B2
(45) Date of Patent: Jun. 20, 2017

(54) SELF-FEEDBACK CONTROL CIRCUIT

(71) Applicant: AMAZING MICROELECTRONIC CORP., New Taipei (TW)

(72) Inventors: Long-Xi Chang, Hsinchu County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 14/955,571

(22) Filed: Dec. 1, 2015

(65) Prior Publication Data

US 2017/0063352 A1     Mar. 2, 2017

(30) Foreign Application Priority Data

Aug. 27, 2015    (TW) .............................. 104128100 A

(51) Int. Cl.
| | |
|---|---|
| H03L 5/00 | (2006.01) |
| H03K 5/003 | (2006.01) |
| G06F 13/40 | (2006.01) |
| H03K 19/0185 | (2006.01) |

(52) U.S. Cl.
CPC ......... *H03K 5/003* (2013.01); *G06F 13/4072* (2013.01); *H03K 19/018521* (2013.01)

(58) Field of Classification Search
CPC .... H03K 17/164; H03K 17/668; H03K 17/10; H03K 17/102; H03K 17/12; H03K 17/122; H03K 17/161; H03K 17/30; H03K 17/302; H03K 19/0013; H03K 19/00315; H03K 19/018521; H03K 19/00307; H03K 19/00346; H03K 19/00353; H03K 19/00361; H03K 5/007; H04L 25/026

USPC ........................................ 327/307, 108–112
See application file for complete search history.

(56) References Cited

U.S. PATENT DOCUMENTS

| | | | |
|---|---|---|---|
| 4,682,047 A | * 7/1987 | von Sichart | G01R 19/16519 326/30 |
| 5,357,144 A | 10/1994 | Tanaka | |
| 6,605,963 B2 | * 8/2003 | Kitamoto | H03K 3/356113 326/62 |
| 7,652,511 B2 | 1/2010 | Chuang et al. | |

(Continued)

FOREIGN PATENT DOCUMENTS

| | | |
|---|---|---|
| CN | 1968018 A | 5/2007 |
| CN | 101179543 A | 5/2008 |

*Primary Examiner* — Lincoln Donovan
*Assistant Examiner* — Diana J Cheng
(74) *Attorney, Agent, or Firm* — Rosenberg, Klein & Lee

(57) ABSTRACT

A self-feedback control circuit is connected to a controller area network bus for controlling a high-level output and a low-level output, comprising a controller area network driving circuit and a replica circuit. The replica circuit is connected in parallel with the controller area network driving circuit and comprises an upper feedback path and a lower feedback path. The upper feedback path and the lower feedback path are connected jointly to a common mode, and the replica circuit provides a feedback signal from the common mode such that the feedback signal is able to be respectively transmitted to two individual transistors of the controller area network driving circuit through the upper feedback path and through the lower feedback path so as to control DC level stability of the high-level output and the low-level output.

12 Claims, 7 Drawing Sheets

(56) References Cited

U.S. PATENT DOCUMENTS

| | | |
|---|---|---|
| 7,777,546 B2 | 8/2010 | Liu |
| 8,427,220 B2 * | 4/2013 | Suzuki ............ H03K 19/00361 |
| | | 327/309 |
| 2003/0112049 A1 | 6/2003 | Wang |

* cited by examiner

SELF-FEEDBACK CONTROL CIRCUIT

This application claims priority for Taiwan patent application no. 104128100 filed on Aug. 27, 2015, the content of which is incorporated in its entirely.

BACKGROUND OF THE INVENTION

Field of the Invention

The present invention is related to a control circuit, and more particularly to a control circuit which comprises both feedback paths and can be widely applied to various controller-area-network bus application systems.

Description of the Prior Art

As known, controller area network (CAN) is a kind of specification established in early 1990's, got standardized as ISO 11898-1 in 1993, and widely used in all kinds of vehicles and electronic devices later on. In general, controller area network includes a serial bus, which provides high security level and efficient real-time control. Also, it is able to ensure debugging and priority determining mechanism, thereby making transmissions for internet messages much more reliable and efficient than ever. From this point of view, it is believed that the controller area network nowadays not only has highly flexible adjustment ability which can accommodate more station numbers in existed internet without modifying its software and/or hardware, but also enhances network upgrading conveniences since its data transmission path need not build upon certain specific standard stations.

Please refer to FIG. 1, which is a schematic drawing of a conventional controller area network bus, wherein two stations, i.e. a station 21 and a station 23 are disposed in the controller area network and are individually connected to a common bus 30 through each of the can-transceivers 11. A high-level output CANH and a low-level output CANL are utilized to provide a differential signal so as to achieve transmitting signals. In the digital logic design nowadays, for example as shown in FIG. 2, when the high-level output CANH and the low-level output CANL are both 2.5V, then the digital signal output will be "1". On the other hand, when the high-level output CANH is raised to 3.5V and the low-level output CANL is lowered to 1.5V, then the digital signal output will become "0". For maintaining a DC stability of the high-level output CANH and the low-level output CANL, a prior art such as U.S. Pat. No. 6,922,073 has disclosed a certain circuit diagram to balance its bus output voltages, in which an output circuit and a preamplifier are needed to comply with a single-path control circuit so as to control a voltage source of the preamplifier. By such arrangements, an effective resistance $R_{on}$ at one end of the circuit will be equal to another effective resistance at the other end, whereby the DC stability control can be achieved.

However, it shall be noticed that in order to achieve the DC stability control, a great number of electronic components must be used no matter from the systematic design or IC chip design point of view. In addition, the circuit complexity would be accordingly increased as well. Under such circumstances, the production cost for the circuit and numbers of components must be dramatically raised too, which induces severe budget issues.

On account of all, it should be apparent and obvious that there is indeed an urgent need for the professionals in the field for a novel control circuit to be developed so as to solve the above-mentioned problems occurring in the prior design.

SUMMARY OF THE INVENTION

In order to overcome the above-mentioned disadvantages, one major objective in accordance with the present invention is provided for a novel and creative self-feedback control circuit which can successfully solves the problems of prior arts and achieve precise control ability for output DC voltage level.

Another objective in accordance with the present invention is provided for a novel self-feedback control circuit, wherein a replica circuit comprising an upper feedback path and a lower feedback path is used for providing a feedback signal from a common mode therein. By employing the feedback signal, it provides control to each gate of the transistors disposed in the upper feedback path and the lower feedback path so as to achieve DC voltage control of the output voltages.

And yet another objective in accordance with the present invention is provided for a novel self-feedback control circuit, in which the circuit is not only able to be applied to controller area network buses, but also widely used in various control systems in other industries for maintain DC output signal stability.

For achieving the above mentioned objectives, the present invention provides a self-feedback control circuit, which is electrically connected to a controller area network bus for controlling a high-level output and a low-level output. According to one embodiment of the present invention, the self-feedback control circuit comprises a controller area network driving circuit and a replica circuit. The controller area network driving circuit is connected to the controller area network bus and comprises a first transistor, a second transistor, a first passive element and a second passive element, wherein the first transistor and the first passive element are connected in series between an input voltage and the high-level output while the second transistor and the second passive element are connected in series between a ground and the low-level output.

The replica circuit is connected in parallel with the controller area network driving circuit and comprises an upper feedback path and a lower feedback path, wherein the upper feedback path and the lower feedback path are connected jointly to a common mode, and the replica circuit provides a feedback signal from the common mode. As such, the feedback signal can be respectively transmitted to the first transistor of the controller area network driving circuit through the upper feedback path and to the second transistor of the controller area network driving circuit through the lower feedback path so as to control DC level stability of the high-level output and the low-level output.

Also, according to one embodiment of the present invention, the upper feedback path may further comprise a third transistor, a third passive element and a third resistor, in which the third transistor, the third passive element and the third resistor are connected in series between the input voltage and the common mode. On the other hand, the lower feedback path further comprises a fourth transistor, a fourth passive element and a fourth resistor, in which the fourth transistor, the fourth passive element and the fourth resistor are connected in series between a ground and the common mode. By such arrangements, the third transistor is electrically connected to the first transistor of the controller area network driving circuit and controls the first transistor of the controller area network driving circuit while the fourth transistor is electrically connected to the second transistor of the controller area network driving circuit and controls the second transistor of the controller area network driving circuit.

Furthermore, according to the embodiment of the present invention, the third resistor is designed to be n times the resistance of an output resistor of the controller area network bus, and the third transistor and the third passive element are respectively 1/n times the current of the first transistor and the first passive element of the controller area network driving circuit. Similarly, the fourth resistor is designed to be n times the resistance of an output resistor of the controller area network bus, the fourth transistor and the fourth passive element are respectively 1/n times the current of the second transistor and the second passive element of the controller area network driving circuit, and n is a positive integer.

Based on the above, the present invention is well designed and indeed discloses a novel self-feedback control circuit, which is able to control a voltage drop between a high-level and low-level output voltage around 2V and its DC offset under 100 mV as well. Thus, it is believed that the present invention is advantageous of having excellent control stability over DC voltage signals as well as maintaining precise control ability to the DC output levels when compared to the prior arts.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
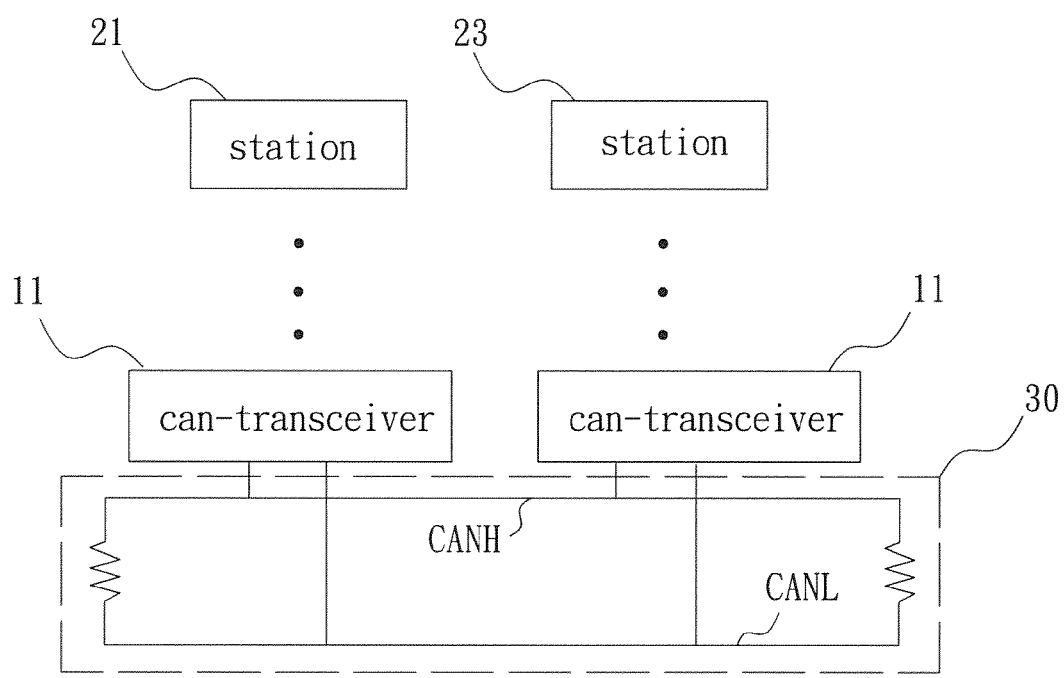
FIG. 1 shows a schematic drawing of a conventional controller area network bus.
Figure 2:
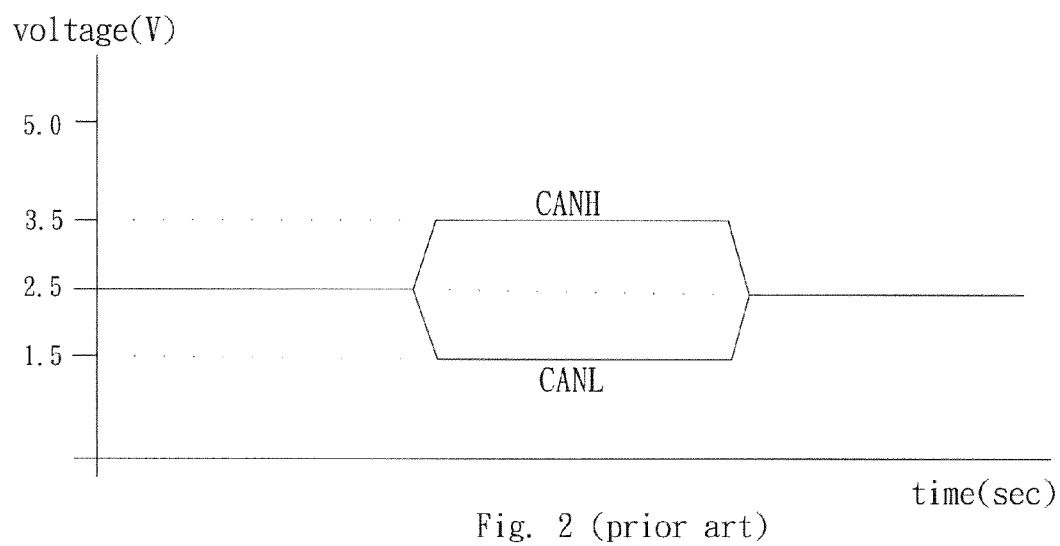
FIG. 2 shows a wave form of a conventional controller area network bus with respect with FIG. 1.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
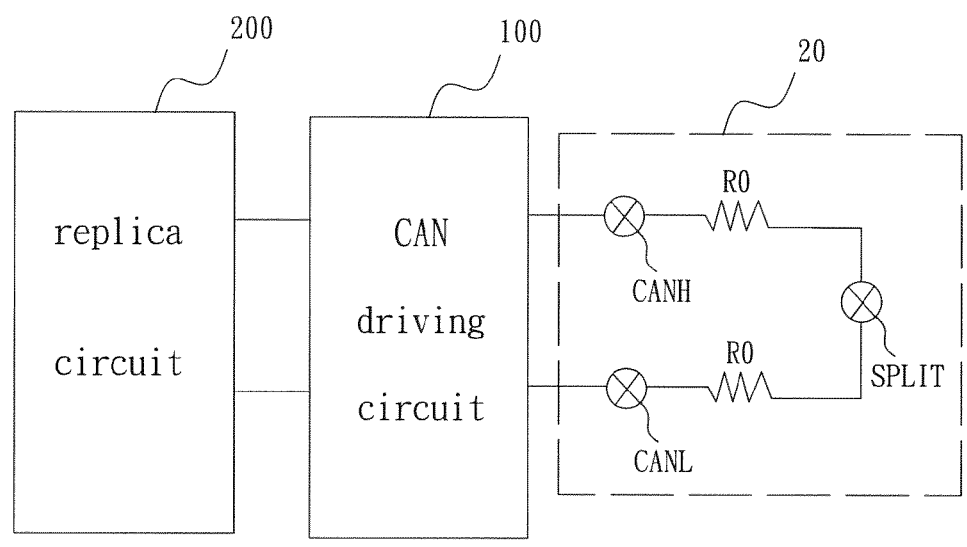
FIG. 3 shows a schematic drawing of a self-feedback control circuit in accordance with one embodiment of the present invention.

Please refer to FIG. 3, which shows a schematic drawing of a self-feedback control circuit in accordance with one embodiment of the present invention. As shown in FIG. 3, the self-feedback control circuit 1 of the present invention is electrically connected to a controller area network bus (CAN BUS) 20, and the controller area network bus 20 is aimed to transmit a differential signal through a high-level output CANH and a low-level output CANL. Meanwhile, two output resistors R0 are individually connected between the high-level output CANH and a mid-level output SPLIT and between the mid-level output SPLIT and the low-level output CANL. In general, the resistance of the output resistor R0 can be selected to be 60 ohms so that two output resistors R0 in series form a resistance of 120 ohms. However, as required people skilled in the art are allowed to make any modifications regarding the resistance of the output resistor. The present invention is not limited thereto.

Figure 4:
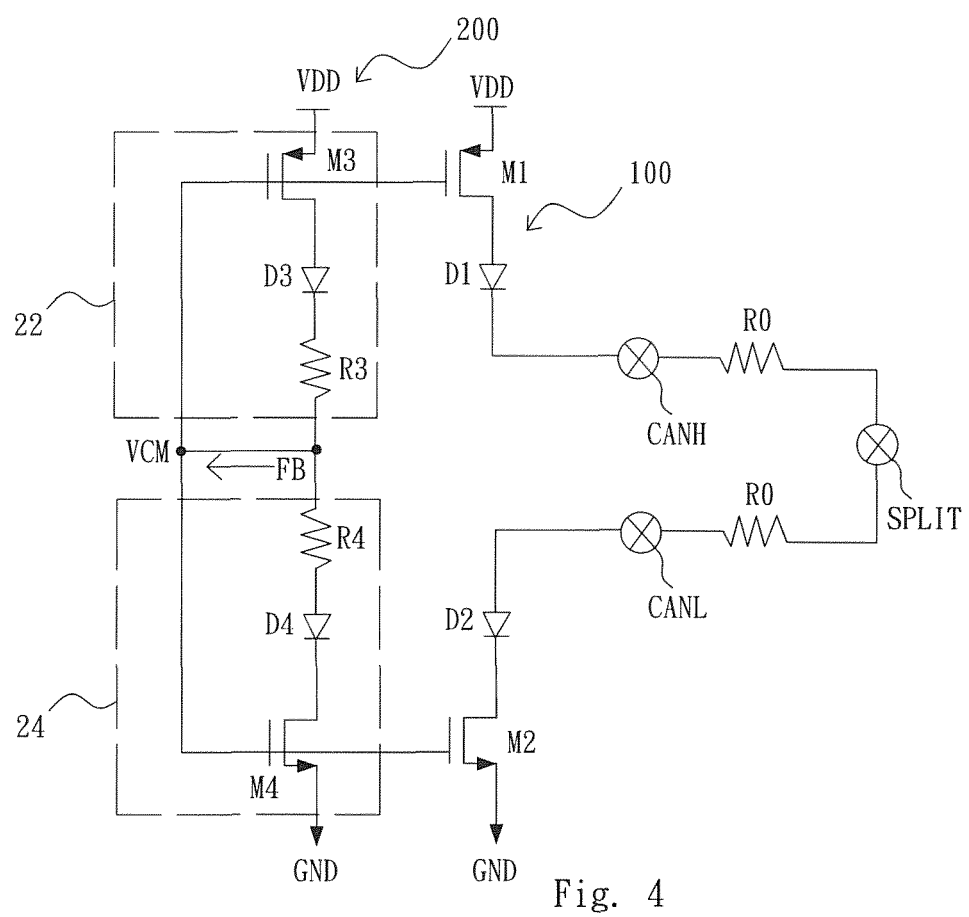
FIG. 4 shows a detailed diagram of a self-feedback control circuit in accordance with one embodiment of the present invention.

According to one embodiment of the present invention, the self-feedback control circuit 1 of the present invention comprises a controller area network driving circuit (CAN driving circuit) 100 and a replica circuit 200 in parallel with the CAN driving circuit 100. Please refer to FIG. 4, which shows a detailed diagram of the self-feedback control circuit in accordance with one embodiment of the present invention. As shown in FIG. 4, the CAN driving circuit 100 is connected to the controller area network bus 20, and the CAN driving circuit 100 comprises a first transistor M1, a second transistor M2, a first passive element D1 and a second passive element D2, in which the first transistor M1 and the first passive element D1 are connected in series between an input voltage VDD and the high-level output CANH while the second transistor M2 and the second passive element D2 are connected in series between a ground GND and the low-level output CANL.

The replica circuit 200 is connected in parallel with the CAN driving circuit 100 and the replica circuit 200 includes both feedback paths, i.e. an upper feedback path 22 and a lower feedback path 24. As shown in FIG. 4, the upper feedback path 22 and the lower feedback path 24 are connected jointly to a common mode VCM, and provide a feedback signal FB from the common mode VCM. As such, the feedback signal FB can be transmitted to the first transistor M1 through the upper feedback path 22 and to the second transistor M2 through the lower feedback path 24, respectively so as to control the DC level stability of the high-level output CANH and the low-level output CANL.

Figure 5:
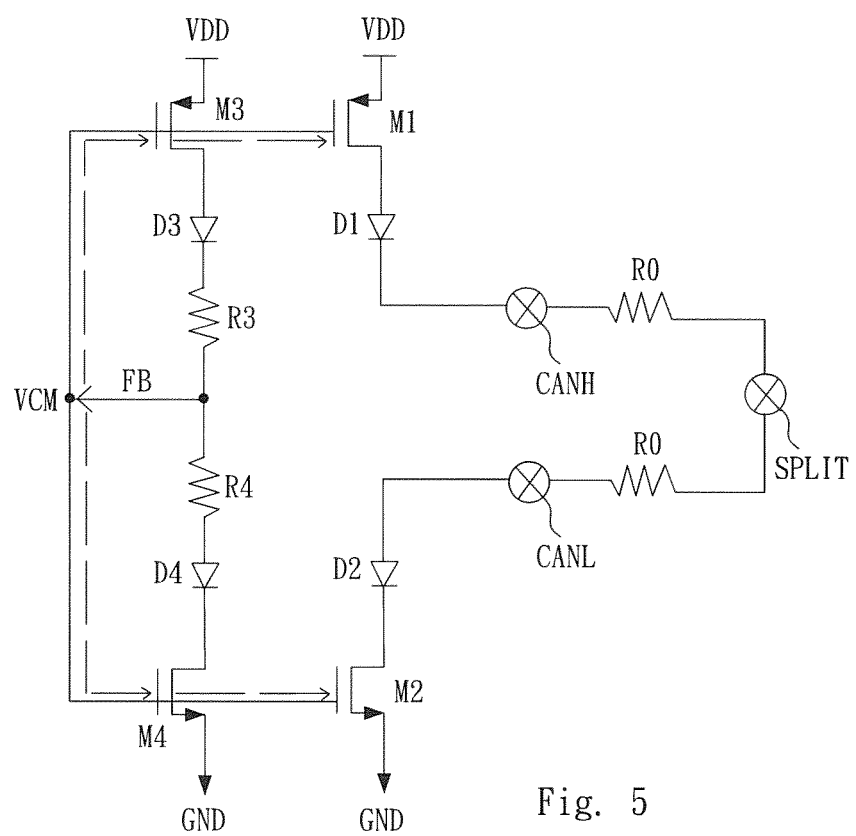
FIG. 5 shows an operational diagram of a self-feedback control circuit in accordance with one embodiment of the present invention.

FIG. 5 shows an operational diagram of the self-feedback control circuit in accordance with one embodiment of the present invention. Please refer to FIG. 4 and FIG. 5 at the same time for the following description. In details, the upper feedback path 22 comprises a third transistor M3, a third passive element D3 and a third resistor R3 while the lower feedback path 24 comprises a fourth transistor M4, a fourth passive element D4 and a fourth resistor R4. According to the embodiment of the present invention, the third transistor M3, the third passive element D3 and the third resistor R3 are connected in series between the input voltage VDD and the common mode VCM, and the fourth transistor M4, the fourth passive element D4 and the fourth resistor R4 are connected in series between the ground GND and the common mode VCM. In this embodiment, the present invention adopts each of the first transistor M1 and the third transistor M3 to be a P metal oxide semiconductor (PMOS), each of the second transistor M2 and the fourth transistor M4 to be an N metal oxide semiconductor (NMOS), and each of the first passive element D1, the second passive element D2, the third passive element D3 and the fourth passive element D4 is a diode so as to show an exemplary embodiment of the present invention.

According to one embodiment of the present invention, the third transistor M3 is connected to the first transistor M1 and controls a gate of the first transistor M1. The fourth transistor M4 is connected to the second transistor M2 and controls a gate of the second transistor M2. In addition, when considering the size and the resistance of each element, the present invention designs that, the third resistor R3 should be n times the resistance of the output resistor R0, the third transistor M3 and the third passive element D3 should be respectively 1/n times the current of the first transistor M1 and the first passive element D1, and n is a positive integer. Similarly, when considering the lower feedback path 24, the present invention designs that, the fourth resistor R4 should be n times the resistance of the output resistor R0, the fourth transistor M4 and the fourth passive element D4 should be respectively 1/n times the current of the second transistor M2 and the second passive element D2, and n is a positive integer. Therefore, since the replica circuit 200 of the present invention is designed to comprise both feedback paths, i.e. the upper feedback path 22 and the lower feedback path 24, and also sizes and resistances of each of the elements including the first transistor M1, the second transistor M2, the third transistor M3, the fourth transistor M4, the first passive element D1, the second passive element D2, the third passive element D3, the fourth passive element D4, the third resistor R3, the fourth resistor R4 and the output resistor R0 are well selected, the objective of the present invention which is aimed to perform excellent DC level control of the high-level output CANH and the low level output CANL is successfully achieved.

Figure 6:
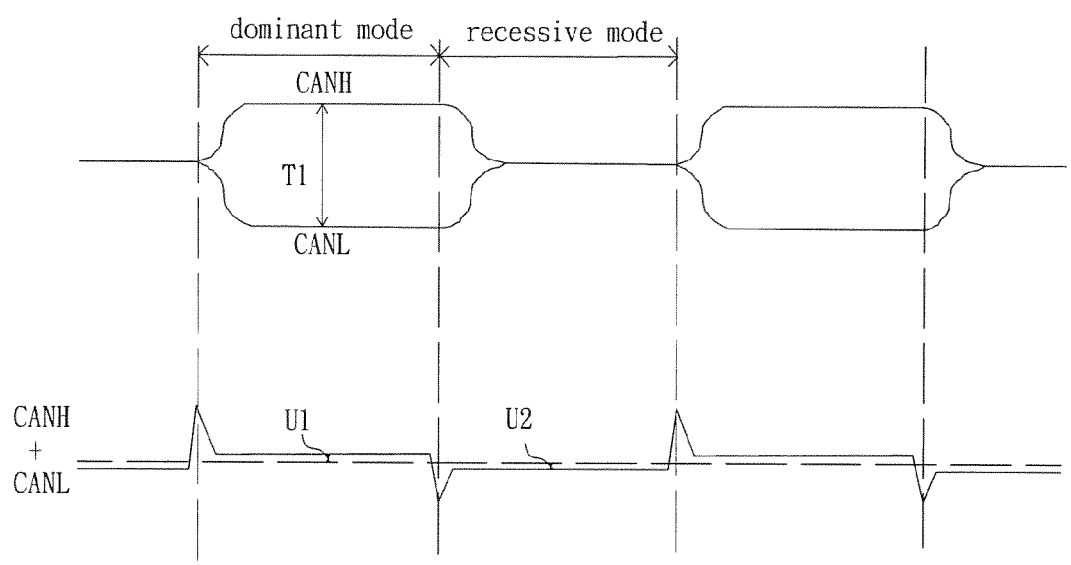
FIG. 6 shows a wave form of the self-feedback control circuit being applied to a controller area network bus in accordance with one embodiment of the present invention.

Next, the present invention is verified with experimental results provided below. Please refer to FIG. 6, which shows a wave form of the self-feedback control circuit being applied to a controller area network bus in accordance with one embodiment of the present invention. As shown in FIG. 6, it is obvious that by employing the proposed self-feedback control circuit, a voltage level of the mid-level output SPLIT is well controlled to be half a sum of the high-level output CANH and the low-level output CANL. That is to say, SPLIT=(CANH+CANL)/2. Also, with respect to the differential signal the controller area network bus outputs, it can be seen that a voltage drop T1 between the high-level output CANH and the low-level output CANL is fixed within a region such as 1.5V-3V. Preferably, the voltage drop T1 can be controlled to be 2V. Besides, when the circuit is switched between a dominant mode and a recessive mode as shown in FIG. 6, then an offset U1, U2 of the high-level output CANH plus the low-level output CANL can be controlled under 100 mV. As a result, based on at least one proof provided above, it is believed that the proposed self-feedback control circuit of the present invention is indeed beneficial to controlling DC level stability of output voltages and thus can be widely utilized to not only controller area network buses but also other industrial application systems as an extraordinarily performing self-feedback circuit design.

Figure 7:
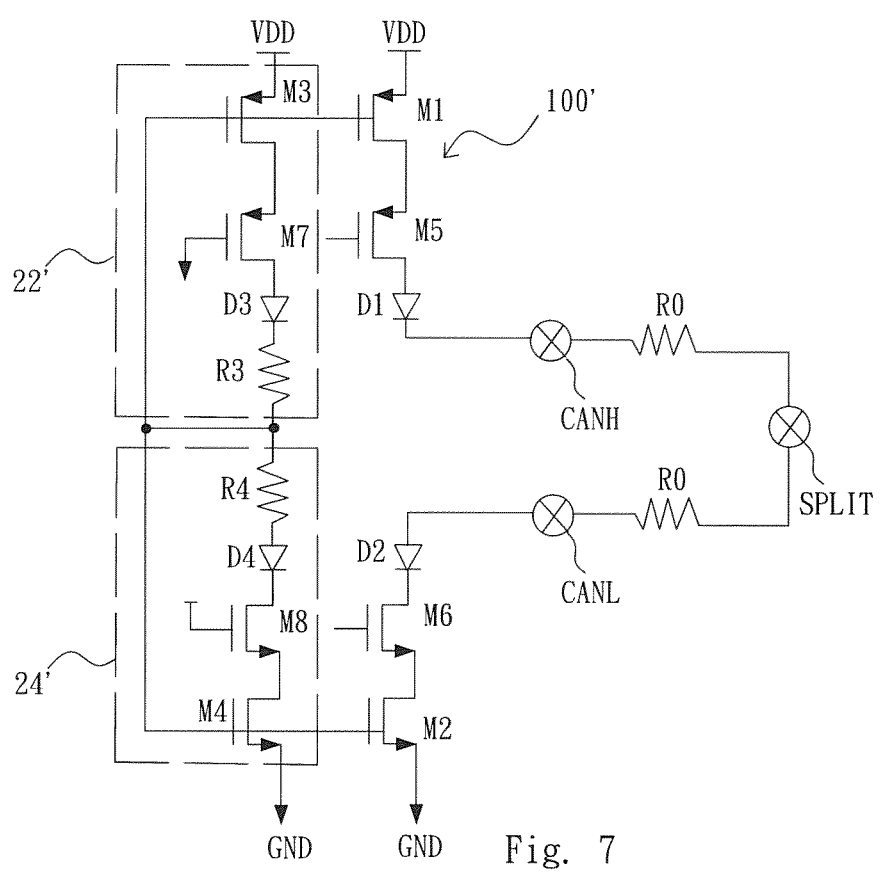
FIG. 7 shows a detailed diagram of a self-feedback control circuit in accordance with another embodiment of the present invention.

In another aspect, FIG. 7 shows a detailed diagram of the self-feedback control circuit in accordance with another embodiment of the present invention. What differs from FIG. 4 in the previously described embodiment is that, the CAN driving circuit 100' in FIG. 7 further comprises at least one fifth transistor M5 and at least one sixth transistor M6, wherein the fifth transistor M5 is connected in series between the first transistor M1 and the first passive element D1, and the sixth transistor M6 is connected in series between the second transistor M2 and the second passive element D2. To be more specific, a number of the fifth transistor M5 can be optionally to be one and/or more than one, and a number of the sixth transistor M6 can also be one and/or more than one as well. In this embodiment of the present invention as shown in FIG. 7, the present invention simply adopts the CAN driving circuit 100' which comprises single fifth transistor M5 and single sixth transistor M6 as an exemplary embodiment of the present invention, nevertheless, the present invention should not be limited thereto. In other words, when applying a similar sense and methodology, other embodiments of the present invention for example, a plurality of fifth transistors M5 and a plurality of sixth transistors M6 are disposed in the proposed circuit, can also be implemented while those skilled in the art can figure their own designs based on the present invention without departing from the scope or spirit of the invention.

As such, according to such embodiment of the present invention, for corresponding to the fifth transistor M5, the upper feedback path 22' should further comprises at least one seventh transistor M7 which is connected between the third transistor M3 and the third passive element D3, wherein each of the fifth transistor M5 and the seventh transistor M7 is designed as a P metal oxide semiconductor (PMOS), and a number of the disposed seventh transistor M7 should be the same as that of the fifth transistor M5. Similarly, for corresponding to the sixth transistor M6, the lower feedback path 24' should further comprises at least one eighth transistor M8 which is connected between the fourth transistor M4 and the fourth passive element D4, wherein each of the sixth transistor M6 and the eighth transistor M8 is designed as an N metal oxide semiconductor (NMOS), and a number of the disposed eighth transistor M8 should be the same as that of the sixth transistor M6. Furthermore, the seventh transistor M7 is 1/n times the current of the fifth transistor M5, the eighth transistor M8 is 1/n times the current of the sixth transistor M6, and n is a positive integer.

Therefore, to sum up, the present invention indeed discloses a novel self-feedback control circuit, which can not only process statistic control ability to output voltages of controller area network buses, maintaining an output differential signal about 2V, but also dynamically control its glitch peak within proper specifications when switching between a dominant mode and a recessive mode. As a result, when compared to the prior arts, it is obvious that the present invention apparently shows much more effective performance in both low fabrication cost and low circuit complexity. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A self-feedback control circuit, electrically connected to a controller area network bus for controlling a high-level output and a low-level output, comprising:
a controller area network driving circuit, connected to said controller area network bus and comprising a first transistor, a second transistor, a first passive element and a second passive element, wherein said first transistor and said first passive element are connected in series between an input voltage and said high-level output while said second transistor and said second passive element are connected in series between a ground and said low-level output; and
a replica circuit, connected in parallel with said controller area network driving circuit and comprising an upper feedback path and a lower feedback path, wherein said upper feedback path and said lower feedback path are connected jointly to a common mode, said replica circuit provides a feedback signal from said common mode, and said feedback signal is respectively transmitted to said first transistor through said upper feedback path and to said second transistor through said lower feedback path so as to control DC level stability of said high-level output and said low-level output, said upper feedback path further comprises a third transistor, a third passive element and a third resistor, in which said third transistor, said third passive element and said third resistor are connected in series between said input voltage and said common mode, and said third transistor is electrically connected to said first transistor of said controller area network driving circuit and controls said first transistor of said controller area network driving circuit, and each of said first transistor and said third transistor is a P metal oxide semiconductor (PMOS), and gates of said first transistor and said third transistor are electrically connected with said common mode, and said lower feedback path further comprises a fourth transistor, a fourth passive element and a fourth resistor, in which said fourth transistor, said fourth passive element and said fourth resistor are connected in series between said ground and said common mode, and said fourth transistor is electrically connected to said second transistor of said controller area network driving circuit and controls said second transistor of said controller area network driving circuit, and each of said second transistor and said fourth transistor is an N metal oxide semiconductor (NMOS), and gates of said second transistor and said fourth transistor are electrically connected with said common mode.

2. The self-feedback control circuit of claim 1, wherein said controller area network bus further comprises at least two output resistors, wherein one of said output resistors is connected between said high-level output and a mid-level output, and the other of said output resistors is connected between said mid-level output and said low-level output.

3. The self-feedback control circuit of claim 1, wherein said third resistor is n times the resistance of said output resistor, said third transistor and said third passive element are respectively 1/n times the current of said first transistor and said first passive element of said controller area network driving circuit, and n is a positive integer.

4. The self-feedback control circuit of claim 3, wherein said fourth resistor is n times the resistance of said output resistor, said fourth transistor and said fourth passive element are respectively 1/n times the current of said second transistor and said second passive element of said controller area network driving circuit, and n is a positive integer.

5. The self-feedback control circuit of claim 4, wherein each of said first passive element, said second passive element, said third passive element and said fourth passive element is a diode.

6. The self-feedback control circuit of claim 1, wherein said controller area network driving circuit further comprises at least one fifth transistor and at least one sixth transistor, said fifth transistor is connected in series between said first transistor and said first passive element, and said sixth transistor is connected in series between said second transistor and said second passive element.

7. The self-feedback control circuit of claim 6, wherein said upper feedback path further comprises at least one seventh transistor which is connected between said third transistor and said third passive element, and a number of said at least one seventh transistor is equal to a number of said at least one fifth transistor.

8. The self-feedback control circuit of claim 7, wherein each of said fifth transistor and said seventh transistor is a P metal oxide semiconductor (PMOS).

9. The self-feedback control circuit of claim 8, wherein said seventh transistor is 1/n times the current of said fifth transistor of said controller area network driving circuit, and n is a positive integer.

10. The self-feedback control circuit of claim 7, wherein said lower feedback path further comprises at least one eighth transistor which is connected between said fourth transistor and said fourth passive element, and a number of said at least one eighth transistor is equal to a number of said at least one sixth transistor.

11. The self-feedback control circuit of claim 10, wherein each of said sixth transistor and said eighth transistor is an N metal oxide semiconductor (NMOS).

12. The self-feedback control circuit of claim 11, wherein said eighth transistor is 1/n times the current of said sixth transistor of said controller area network driving circuit, and n is a positive integer.

* * * * *